United States Patent
Campi, Jr. et al.

(10) Patent No.: US 8,634,172 B2
(45) Date of Patent: Jan. 21, 2014

(54) SILICON CONTROLLED RECTIFIER BASED ELECTROSTATIC DISCHARGE PROTECTION CIRCUIT WITH INTEGRATED JFETS, METHOD OF OPERATION AND DESIGN STRUCTURE

(75) Inventors: John B. Campi, Jr., Westford, VT (US); Shunhua T. Chang, South Burlington, VT (US); Kiran V. Chatty, Williston, VT (US); Robert J. Gauthier, Jr., Hinesburg, VT (US); Mujahid Muhammad, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 351 days.

(21) Appl. No.: 12/782,296

(22) Filed: May 18, 2010

(65) Prior Publication Data

US 2011/0286135 A1 Nov. 24, 2011

(51) Int. Cl.
*H02H 9/00* (2006.01)
(52) U.S. Cl.
USPC .............................. 361/56; 361/91.1; 361/111
(58) Field of Classification Search
None
See application file for complete search history.

(56) References Cited

U.S. PATENT DOCUMENTS

| | | | | |
|---|---|---|---|---|
| 3,812,405 A * | 5/1974 | Clark | ............................ | 257/134 |
| 5,115,369 A * | 5/1992 | Robb et al. | ....................... | 361/58 |
| 5,140,401 A | 8/1992 | Ker et al. | | |
| 5,237,395 A | 8/1993 | Lee | | |
| 5,400,202 A | 3/1995 | Metz et al. | | |
| 5,506,742 A * | 4/1996 | Marum | ............................ | 361/56 |
| 5,652,153 A * | 7/1997 | Beasom | ........................ | 438/189 |
| 5,734,541 A | 3/1998 | Iniewski et al. | | |
| 5,869,873 A * | 2/1999 | Yu | ................................... | 257/362 |
| 5,932,916 A * | 8/1999 | Jung | .............................. | 257/355 |
| 5,982,601 A | 11/1999 | Lin | | |
| 6,011,420 A | 1/2000 | Watt et al. | | |
| 7,092,227 B2 | 8/2006 | Ker et al. | | |
| 7,243,317 B2 * | 7/2007 | Wang et al. | .................... | 716/112 |
| 7,309,896 B2 | 12/2007 | Kim | | |
| 7,473,973 B2 | 1/2009 | Kondo | | |
| 2009/0303644 A1 * | 12/2009 | Barbier et al. | .................. | 361/56 |
| 2009/0310267 A1 | 12/2009 | Gauthier, Jr. et al. | | |

FOREIGN PATENT DOCUMENTS

CN 101073154 A 11/2007

OTHER PUBLICATIONS

Lou et al., "An Unassisted, Low Trigger . . . Applications", IEEE Electron Device Letters, vol. 28, No. 12, Dec. 2007, pp. 1120-1122.
Zhang et al., "A Quasi-Mixed Mode MOSFET . . . Variations", IEEE, downloaded Oct. 22, 2009, pp. 211-214.
Chen et al., "Optimization on MOS-Triggered . . . ESD Protection", IEEE Transactions on Electron Devices, vol. 56, No. 7, Jul. 2009, pp. 1466-1472.
Chinese Office Action for Chinese Application No. 201110126801.9 dated Jun. 19, 2013, 8 pages.

* cited by examiner

*Primary Examiner* — Jared Fureman
*Assistant Examiner* — Terrance Willoughby
(74) *Attorney, Agent, or Firm* — Anthony Canale; Roberts Mlotkowski Safran & Cole, P.C.

(57) ABSTRACT

An enhanced turn-on time SCR based electrostatic discharge (ESD) protection circuit includes an integrated JFET, method of use and design structure. The enhanced turn-on time silicon controlled rectifier (SCR) based electrostatic discharge (ESD) protection circuit includes an integrated JFET in series with an NPN base.

22 Claims, 4 Drawing Sheets

SILICON CONTROLLED RECTIFIER BASED ELECTROSTATIC DISCHARGE PROTECTION CIRCUIT WITH INTEGRATED JFETS, METHOD OF OPERATION AND DESIGN STRUCTURE

FIELD OF THE INVENTION

The invention relates to silicon controlled rectifiers (SCR) and, more particularly, to an enhanced turn-on time SCR based electrostatic discharge (ESD) protection circuit with an integrated JFET, method of operation and design structure.

BACKGROUND

Diode string triggered silicon controlled rectifiers (SCR) are becoming dominant electrostatic discharge (ESD) devices for high frequency I/Os, as well as becoming ever more popular for use on small voltage island power supplies (low voltage applications). However, such devices have contradictory needs. For example, ESD devices require low trigger current; whereas, higher SCR trigger current is required for normal operations of the SCR to avoid mistriggering but fast turn-on during ESD events.

FIG. 1a shows a schematic of a conventional diode string triggered silicon controlled rectifier (DTSCR) based electrostatic discharge (ESD) device. More specifically, FIG. 1a shows a schematic of a three string diode dual well ESD DTSCR. In this representation, three diodes are in series, with a fourth diode in the body of the SCR. The SCR also includes resistor Rpw and resistor Rnw.

As should be understood by those of skill in the art, the three diode string determines the trigger point voltage of the DTSCR. That is, the diode string controls the voltage to turn on the SCR. For example, in operation, the diode string is triggered (Itrig) to control the voltage in order to turn on the SCR. Also, in operation, the ESD DTSCR discharges ESD current to ground during a positive mode ESD event.

FIG. 1b shows a layout view of a conventional DTSCR based electrostatic discharge (ESD) device of FIG. 1a. More specifically, FIG. 1b shows a cross sectional view of the SCR with cross coupled bipolar transistors which is integrated with trigger diodes to form the. In FIG. 1b, the SCR includes a P+ diffusion and N+ diffusion in a P-well (PNP) and a P+ diffusion and N+ diffusion (NPN) in an N-well. The resistor Rpw is provided in the P-well and the resistor Rnw is in the N-well. As should be well understood, the magnitude of the current (Itrig) is proportional to the substrate resistance.

FIG. 2 shows a graph of voltage vs. current for the conventional DTSCR based electrostatic discharge (ESD) device of FIGS. 1a and 1b. As shown in the graph, at Von, the four diodes of FIG. 1a are turned on, and the SCR starts to conduct current. At Vtrig, Itrig, sufficient current is in the diodes in order to turn the SCR in an on state. That is, the diode string is triggered (Itrig) to turn on the SCR. At Vh, Ih, current is no longer conducting through the diodes. Instead, at this stage, the current is conducting through the SCR to ground though the PNPN ground terminal.

As noted above, the magnitude of the current, Itrig, is proportional to the substrate resistance, Rpw. That is, Itrig is controlled by Rpw. As such, if Itrig is desired to be low, it is necessary to have an increased substrate resistance (Rpw) high. Also, if Itrig is desired to be high to trigger the SCR, it is necessary to have lower Rpw which will require larger external diodes. The larger external diodes, though, consumes area and capacitance. For example, referring to FIG. 1b, to increase Rpw and lower the Itrig, it is necessary to move the Rpw to the left of FIG. 1b, thus increasing the total area of the structure which further wastes valuable substrate real estate.

Accordingly, there exists a need in the art to overcome the deficiencies and limitations described hereinabove.

SUMMARY

In a first aspect of the invention, an enhanced turn-on time silicon controlled rectifier (SCR) based electrostatic discharge (ESD) protection circuit comprises an integrated JFET in series with an NPN base.

In another aspect of the invention, an operation of an enhanced turn-on time silicon controlled rectifier (SCR) based electrostatic discharge (ESD) protection circuit comprises an integrated JFET in series with an NPN base, and comprises lowering a trigger current by having a resistance of the JFET device increase.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of an SCR based ESD protection device with integrated JFET, which comprises the structures of the present invention. In still further embodiments, a method in a computer-aided design system is provided for generating a functional design model of the SCR based ESD protection device with integrated JFET. The method comprises generating a functional representation of the structural elements of the SCR based ESD protection device with integrated JFET.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

FIG. 1b shows a cross sectional layout view of a conventional DTSCR based electrostatic discharge (ESD) device of FIG. 1a;

DETAILED DESCRIPTION

The invention relates to silicon controlled rectifiers (SCR) and, more particularly, to an enhanced turn-on time SCR based electrostatic discharge (ESD) protection circuit with an integrated JFET, method of operation and design structure. Advantageously, the use of the JFET in series with an NPN base allows low resistance contact during normal chip operation which, in turn, is beneficial in prevent SCR mis-triggering. On the other hand, the use of the JFET in series with the NPN base allows high resistance (pinched off JFET) contact during ESD event which, in turn, is beneficial in lowering the trigger current/voltage. This latter feature reduces turn-on time of the SCR. Thus, in embodiments, the JFET allows "low resistance" during normal operation (e.g., about 3 V or less on I/O pad) but creates high resistance during ESD events (e.g., about 4 to 5V on I/O pad).

Figure 1A:
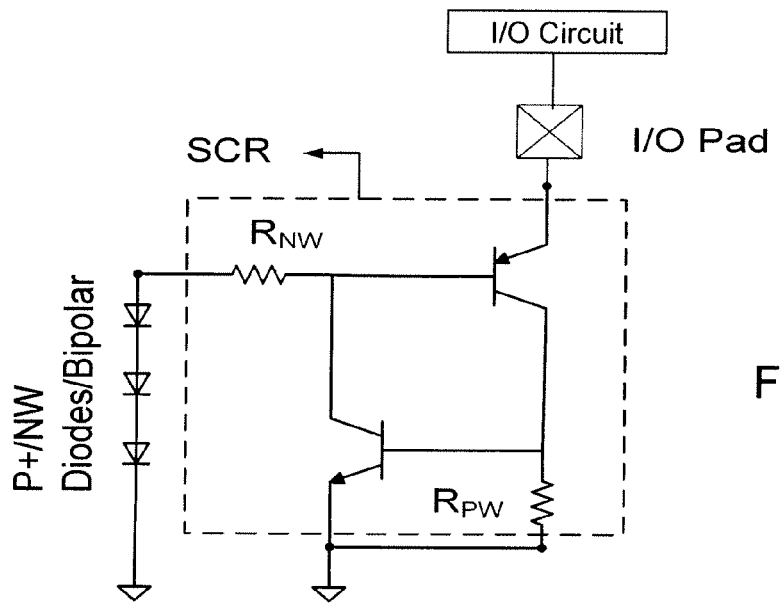
FIG. 1a shows a schematic of a conventional diode string triggered silicon controlled rectifier (DTSCR) based electrostatic discharge (ESD) device.
Figure 1B:
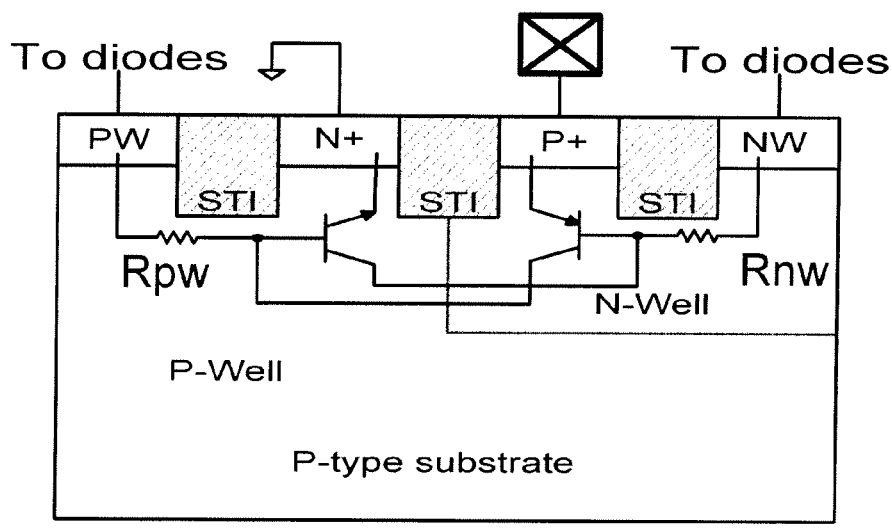
Figure 2:
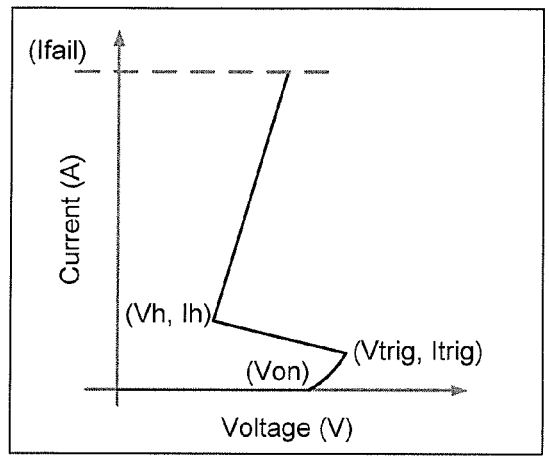
FIG. 2 shows a graph of voltage vs. current for the conventional DTSCR based electrostatic discharge (ESD) device.
Figure 3:
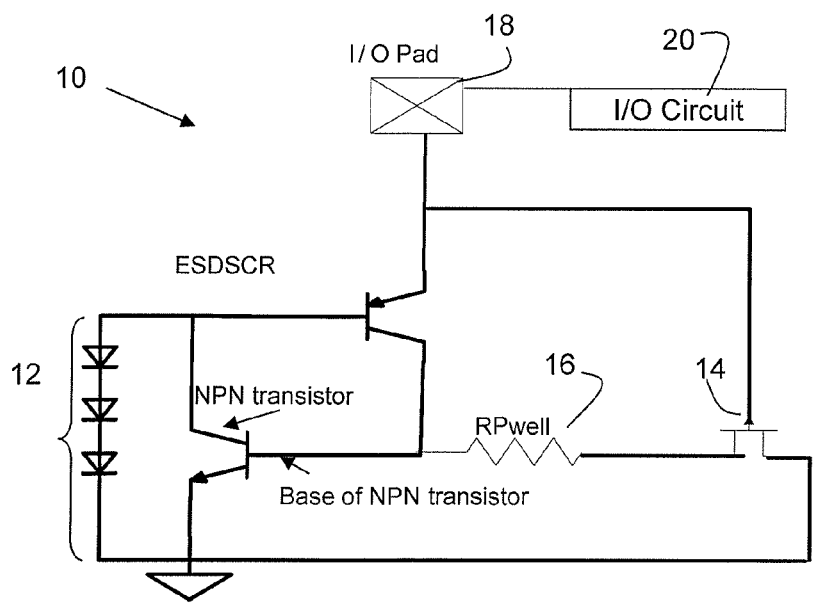
FIG. 3 shows a schematic of a DTSCR based electrostatic discharge (ESD) device with an integrated JFET device in accordance with aspects of the invention.

FIG. 3 shows a schematic of a DTSCR based electrostatic discharge (ESD) device with an integrated JFET device in accordance with aspects of the invention. In particular, the DTSCR 10 includes a diode string 12 of three diodes in series. The DTSCR 10 further includes a JFET device 14, in series with a resistor 16 in a P well. In operation, when the gate voltage is high, the JFET can be designed so the resistance is high which lowers the trigger current, Itrig; whereas, when the gate voltage is low, the JFET can be designed so the resistance is low.

FIG. 3 further shows the DTSCR 10 connected to a conventional I/O pad 18. The I/O pad 18 can be connected to any type of I/O circuit 20. In embodiments, the P well resistor 16 is gate controlled by the I/O pad 18.

In embodiments, the JFET device 14 can have a pinch off voltage in the 3V to 5V range. The pinch off of the JFET device 14 will increase the SCR resistance which, in turn, lowers the trigger current, Itrig. The lower trigger current is advantageous for ESD events. Additionally, the JFET device 14 has an "off resistance" about three orders of magnitude higher or more than the "on" resistance. Accordingly, the JFET device 14 allows "low" resistance to the base of NPN during normal operation but "high" resistance during ESD event, both of which are advantageous for the reasons discussed herein.

More specifically, in operation, when the I/O pad voltage is low (e.g., about 0 V to 3 V), the JFET device 14 will look like a shunt or low resistance device. During functional mode, e.g., the I/O pad voltage is about 0 to 3.6 V, the JFET device 14 looks like an on device, thereby providing low resistance to ground. Thus, when the I/O pad voltage is about 0 to 3.6 V (e.g., functional mode), the Itrig can be high because the JFET device 14 is on. In a non-ESD mode, the resistance is in a low resistance state (e.g., about 0 V to 3.6 V). In this mode, the JFET device 12 is not pinched off.

Figure 4:
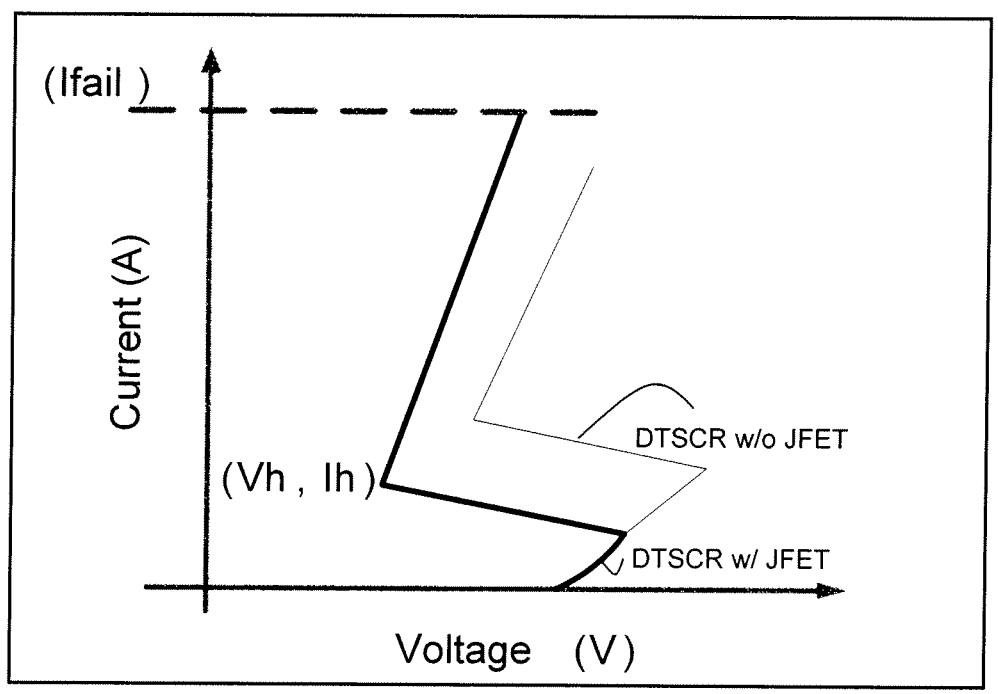
FIG. 4 shows a graph of voltage vs. current for the DTSCR based electrostatic discharge (ESD) device with an integrated JFET device in accordance with aspects of the invention.

FIG. 4 shows a graph of voltage vs. current for the DTSCR based electrostatic discharge (ESD) device with an integrated JFET device in accordance with aspects of the invention. More specifically, FIG. 4 shows the operation of the DTSCR of FIG. 3. As shown, the trigger current, Itrig, is lower with the JFET. Thus, as should be understood by those of skill in the art, it is possible to have the JFET at a high resistance during an ESD event by pinching off the JFET device 14. The pinch off of the JFET device 14 will increase the resistance of the SCR 10 which, in turn, provides a lower Itrig. The trigger current, Itrig, drops for ESD events.

Figure 5:
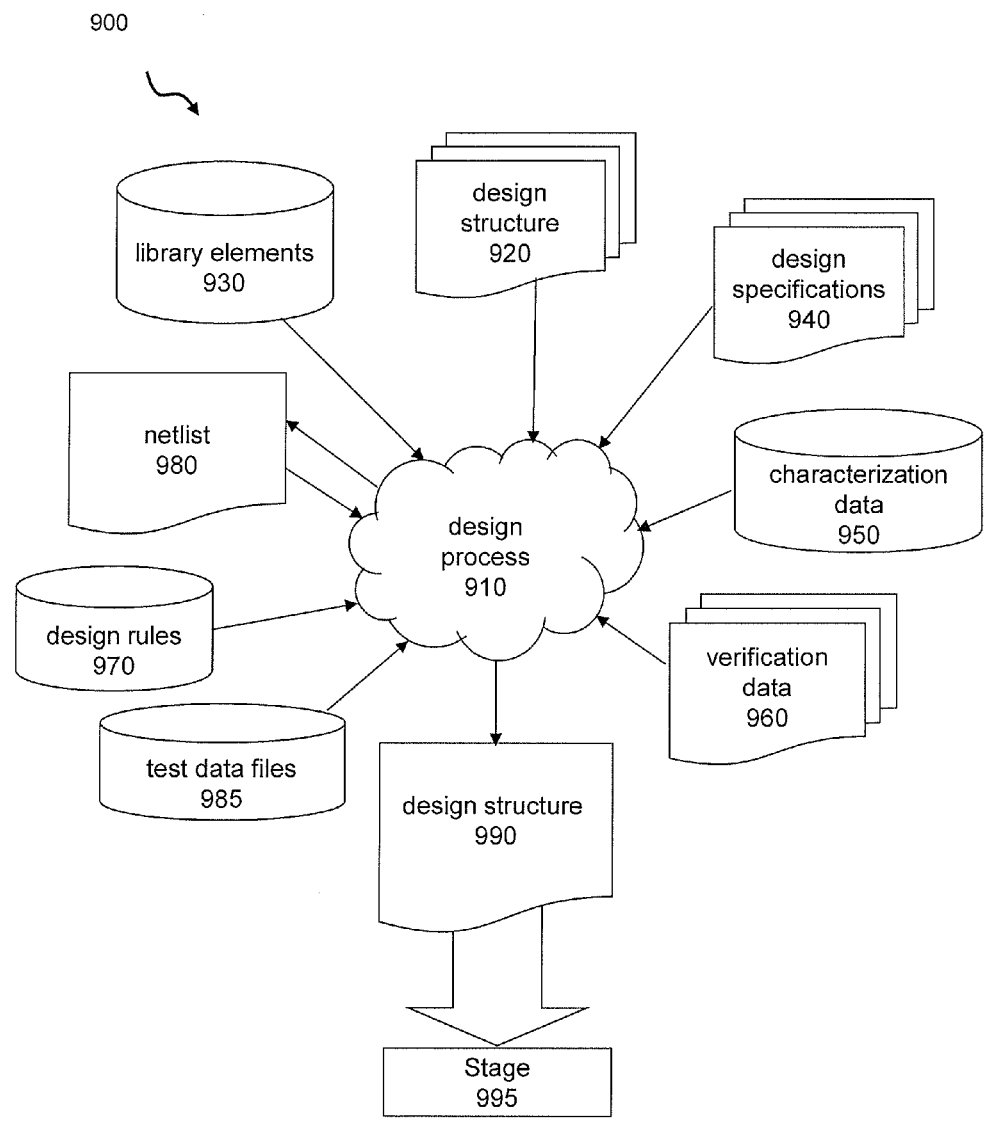
FIG. 5 is a flow diagram of a design process used in semiconductor design, manufacture, and/or test.

FIG. 5 is a flow diagram of a design process used in semiconductor design, manufacture, and/or test. FIG. 5 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIG. 3. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 5 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIG. 3. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIG. 3 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIG. 3. In one embodiment, design structure 990 may comprise a compiled, executable HDL simulation model that functionally simulates the devices shown in FIG. 3.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIG. 3. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principals of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. An enhanced turn-on time silicon controlled rectifier (SCR) based electrostatic discharge (ESD) protection circuit comprising an integrated JFET is electrically connected with an NPN base, wherein
    the JFET is electrically connected with a p-well resistor, and allows high resistance contact during an ESD event which lowers trigger current/voltage of the JFET, compared to a non-ESD event, and
    the high resistance contact is formed when the JFET pinch-off gate voltage is in the 3 V to 5V range.

2. The enhanced SCR of claim 1, wherein the JFET prevents SCR mis-triggering.

3. The enhanced SCR of claim 1, wherein the JFET reduces turn-on time of the SCR.

4. The enhanced SCR of claim 1, wherein the JFET is pinched off during the ESD event.

5. The enhanced SCR of claim 1, wherein the JFET allows low resistance during the non-ESD event.

6. An enhanced turn-on time silicon controlled rectifier (SCR) based electrostatic discharge (ESD) protection circuit comprising an integrated JFET electrically connected with an NPN base and with a p-well resistor, wherein the JFET allows low resistance during a non-ESD event, and the low resistance includes about 3V or less on an I/O pad.

7. An enhanced turn-on time silicon controlled rectifier (SCR) based electrostatic discharge (ESD) protection circuit comprising an integrated JFET device electrically connected with an NPN base and also electrically connected with a p-well resistor, wherein the JFET device has an off resistance about three orders of magnitude higher than an on resistance.

8. An enhanced turn-on time silicon controlled rectifier (SCR) based electrostatic discharge (ESD) protection circuit comprising an integrated JFET device electrically connected with an NPN base and with a p-well resistor, wherein the JFET device has a pinch off voltage in a range of about 3V to 5V.

9. The enhanced SCR of claim 8, wherein the pinch off of the JFET device increases SCR resistance and lowers trigger current, Itrig of a string of diodes of the SCR.

10. An operation of an enhanced turn-on time silicon controlled rectifier (SCR) based electrostatic discharge (ESD) protection circuit comprising an integrated JFET device electrically connected with an NPN base and with a p-well resistor, comprising lowering a trigger current of the JFET device by having a resistance of the JFET device increase.

11. The operation of claim 10, further comprising increasing the resistance of the JFET when a gate voltage is high.

12. The operation of claim 10, wherein when an I/O pad voltage is about 0 V to 3 V, the JFET device looks like a shunt or low resistance device.

13. The operation of claim 10, wherein when an I/O pad voltage is about 0 to 3V, the JFET device looks like an on device, thereby providing low resistance to ground.

14. A hardware description language (HDL) design structure stored on a tangible machine-readable data storage medium comprising a non-volatile storage medium, the HDL design structure comprising elements that are processed in a computer-aided design system generates a machine-executable representation of an SCR, wherein the SCR comprises an integrated JFET electrically connected with an NPN base and with a p-well resistor, wherein the JFET device has an off resistance about three orders of magnitude higher than an on resistance.

15. The design structure of claim 14, wherein the design structure comprises a netlist.

16. The design structure of claim 14, wherein the design structure resides on storage medium as a data format used for the exchange of layout data of integrated circuits.

17. The design structure of claim 14, wherein the design structure resides in a programmable gate array.

18. The design structure of claim 14, wherein the JFET device has a pinch off voltage in a range of about 3V to 5V.

19. The operation of claim 10, wherein the JFET device allows high resistance contact during ESD event which lowers trigger current/voltage of the JFET device, compared to a non-ESD event, and the high resistance contact is formed when the JFET pinch-off gate voltage is in the 3 V to 5V range.

20. The operation of claim 10, wherein the JFET device allows low resistance during a non-ESD event, and the low resistance includes about 3V or less on an I/O pad.

21. The operation of claim 10, wherein the JFET device has an off resistance about three orders of magnitude higher than an on resistance.

22. The operation of claim 10, wherein the JFET device has a pinch off voltage in a range of about 3V to 5V.

* * * * *